United States Patent [19]

Shimoda et al.

[11] Patent Number: 5,578,942

[45] Date of Patent: Nov. 26, 1996

[54] SUPER VCC DETECTION CIRCUIT

[75] Inventors: Masaki Shimoda; Yoshinori Inoue, both of Hyogo, Japan

[73] Assignee: Mitsubishi Denki Kabushiki Kaisha, Tokyo, Japan

[21] Appl. No.: 487,212

[22] Filed: Jun. 7, 1995

[30] Foreign Application Priority Data

Sep. 30, 1994 [JP] Japan .................................. 6-236944

[51] Int. Cl.$^6$ .................................................. H03K 17/16
[52] U.S. Cl. ................... 326/38; 327/546; 326/34
[58] Field of Search ............................ 326/34, 31, 37, 326/38; 327/545, 546

[56] References Cited

U.S. PATENT DOCUMENTS 4,886,983  12/1989  Taka ........................... 327/546
5,208,488   5/1993  Takiba et al. ................ 327/546
5,281,866   1/1994  Rundel ........................ 327/546
5,451,896   9/1995  Mori .......................... 327/546

Primary Examiner—Edward P. Westin
Assistant Examiner—Richard Roseen
Attorney, Agent, or Firm—Lowe, Price, Leblanc & Becker

[57] ABSTRACT

A transfer gate is provided between an input terminal, receiving voltage Vh of the super Vcc level when a special operating mode is set, and an inverter and an n channel MOS transistor included in a super Vcc detection circuit of a DRAM. The transfer gate is rendered conductive only during a potential detection period during which signal WCBR attain an "H" level. Therefore, a leakage current flowing from the input terminal through the n channel MOS transistor to a ground terminal can be minimized, thereby reducing a consumed current.

11 Claims, 4 Drawing Sheets

10

SUPER VCC DETECTION CIRCUIT

BACKGROUND OF THE INVENTION

1. Field of the Invention

The present invention relates to semiconductor devices. More particularly, the present invention relates to a semiconductor device which detects a potential of an input terminal for a prescribed period and performs operation in accordance with the detected result.

2. Description of the Background Art

A dynamic random access memory (hereinafter referred to as a DRAM) has a special operating modes such as a mode for reducing test time, as well as normal operating modes including read, write, and refresh modes. Special operating modes include (1) a mode in which a substrate potential can be applied from an external terminal, (2) a mode in which more word lines are selected than normally, and (3) a mode for a device having many I/O lines in which I/O lines are short-circuited internally and the device is tested as a device which seemingly has a small number of I/O lines.

These special operation modes are set by applying to a prescribed input/output terminal a voltage Vh of a super Vcc level higher than a power supply level Vcc by several volts. For this reason, a conventional DRAM is provided with a super Vcc detection circuit for detecting application of voltage Vh of the super Vcc level to a prescribed input/output terminal (see FIG. 1).

FIG. 5 is a circuit diagram showing a structure of a conventional super Vcc detection circuit 50. Referring to FIG. 5, super Vcc detection circuit 50 includes n channel MOS transistors 51–55 and an inverter 56. The n channel MOS transistors 51–54 and inverter 56 are serially connected between, for example, an output enable signal input terminal 15 and an output node N56 of circuit 50. The n channel MOS transistors 51–54 have their gates connected to their drains respectively. The n channel MOS transistor 55 has a drain connected to a connection node N55 between n channel MOS transistor 54 and inverter 56, a source connected to a ground terminal 17, and a gate connected to a power supply terminal 18.

Next, operations of super Vcc detection circuit 50 will be described. For simplicity of description, it is assumed that, when an input level is 2 V or higher, inverter 56 regards the input level as "H" (high) and outputs an "L" (low) level, and when an input level is lower than 2 V, it regards the input level as "L" and outputs an "H" level. It is also assumed that a threshold voltage Vth of n channel MOS transistors 51–55 is 0.5 V, power supply level Vcc is 5 V, and a ground level Vss is 0 V.

When a potential of Vcc–Vth or lower is supplied to node N55, n channel MOS transistor 55 is rendered conductive, and node N55 attains ground level Vss. As a result, a super Vcc detection signal /S, which is an output of inverter 56, attains an "H" level.

When a potential higher than Vcc–Vth is supplied to node N55, this causes n channel MOS transistor 55 to have a resistance, thereby reducing the potential of node N55 to a value equal to the supplied potential minus Vcc–Vth. For example, if the potential supplied to node N55 is 6.5 V, the potential of N55 will be: 6.5–(5–0.5)=2.0 V.

As described above, this value of 2.0 V is a minimum value for inverter 56 to recognize an input of "H" level and to output an "L" level. Therefore, in order to make output /S of inverter 56 to an "L" level, a potential of 6.5 V or higher must be supplied to node N55.

The potential supplied to node N55 is equal to the potential applied to input terminal 15 minus 4×Vth. Accordingly, when a potential of 8.5 V (6.5 V+4×0.5 V=8.5 V) is applied to input terminal 15, the output of inverter 56, that is, super Vcc detection signal /S, attains an "L" level, thereby selecting the special operating mode described above.

In a normal operating mode, input terminal 15 receives an output enable signal /OE having two levels of MAX6.5 V and 0 V.

In the conventional super Vcc detection circuit 50, however, when signal /OE is applied to input terminal 15 in a normal operation, a leakage current flows from input terminal 15 through n channel MOS transistors 51–55 to ground terminal 17, resulting in a waste of current.

SUMMARY OF THE INVENTION

An object of the present invention is to provide a semiconductor device consuming only a small amount of current.

Briefly describing, in a semiconductor device of a first aspect of the present invention, a first connection circuit is provided between an input terminal and a potential detection circuit and the first connection circuit is rendered conductive only for a prescribed period during which a potential of the input terminal must be detected. Consequently, a leakage current flowing out from the input terminal through the potential detection circuit to a ground terminal can be minimized, thereby reducing consumed current.

Preferably, the potential detection circuit is activated only for a prescribed period so that consumed current can further be reduced.

Preferably, a voltage down converter is provided for reducing the voltage of the input terminal and supplying the reduced voltage to the potential detection circuit, so that the potential of the input terminal can be reduced to a desired potential to provide for the potential detection circuit.

Preferably, the voltage down converter includes a prescribed number of transistors connected in series and each forming a diode so as to simplify the structure of the converter.

More preferably, a second connection circuit, rendered conductive for a period preceding to the prescribed period during which the potential of the input terminal must be detected, is connected in parallel to the voltage down converter. As a result, a residual voltage of the voltage down converter can be eliminated before the potential of the input terminal is detected, thereby preventing malfunction of a semiconductor device.

Briefly describing, in a semiconductor device in accordance with a second aspect of the present invention, a first connection circuit is provided between an input terminal, and a first voltage down converter and an inverter, and the first connection circuit is rendered conductive only for a prescribed period during which a potential of the input terminal must be detected. As a result, a leakage current flowing out from the input terminal through the first voltage down converter to a ground terminal can be minimized, thereby reducing a consumed current.

Preferably, the first voltage down converter includes a transistor connected between an input node of the inverter and a ground potential line and receiving a power supply potential at its input electrode so as to simplify the structure thereof.

Preferably, the transistor receives a first control signal at its input electrode so that the transistor can be turned off for a period other than the prescribed period, thereby further reducing a consumed current.

Preferably, a second voltage down converter is provided for reducing the voltage of the input terminal and applying the reduced voltage to the first voltage down converter. As a result, the potential of the input terminal can be reduced to a desired potential to supply to the first voltage down converter.

The second voltage down converter includes a prescribed number of transistors connected in series and each forming a diode so as to simplify the structure thereof.

More preferably, a second connection circuit, which is rendered conductive for a period prior to the prescribed period during which the potential of the input terminal must be detected, is connected in parallel to the second voltage down converter. Consequently, the residual voltage of the second voltage down converter can be eliminated before the potential of the input terminal is detected, thereby preventing malfunction of a semiconductor device.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
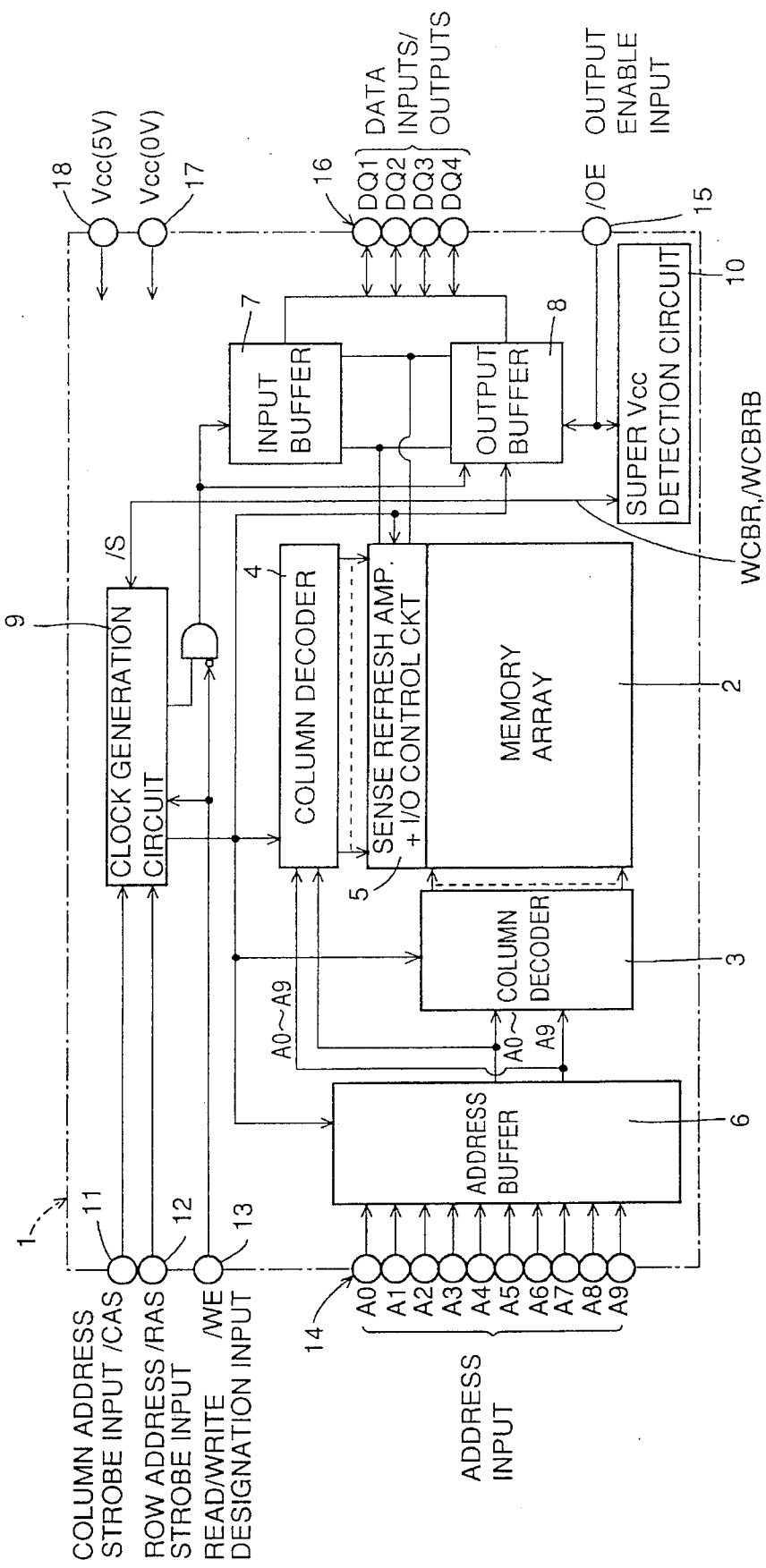
FIG. 1 is a block diagram showing an overall structure of a DRAM in accordance with one embodiment of the present invention.

FIG. 1 is a block diagram showing an overall structure of a DRAM 1 in accordance with one embodiment of the present invention. Referring to FIG. 1, DRAM 1 includes a memory array 2, a row decoder 3, a column decoder 4, a sense refresh amplifier+input/output control circuit 5, an address buffer 6, an input buffer 7, an output buffer 8, a clock generation circuit 9 and a super Vcc detection circuit 10. DRAM 1 also includes control signal input terminals 11–13, an address signal input terminal group 14, an output enable signal input terminal 15, a data input/output terminal group 16, a ground terminal 17 and a power supply terminal 18.

Memory cell array 2 includes a plurality of memory cells (not shown) arranged in a matrix, a word line (not shown) provided corresponding to each row of the memory cells, and a bit line pair (not shown) provided corresponding to each column of the memory cells. Address buffer 6 selectively applies address signals A0–A9 externally applied through address signal input terminal group 14 to row decoder 3 and column decoder 4.

Row decoder 3 selects one of the plurality of word lines in response to row address signals A0–A9 applied from address buffer 6 and activates a memory cell connected to the selected word line. Column decoder 4 selects one of the plurality of bit line pairs in response to column address signals A0–A9 applied from address buffer 6.

In writing operation, input buffer 7 applies data which is input from data input/output terminal group 16 to the selected bit line pair through sense refresh amplifier+input/output control circuit 5. In reading operation, sense refresh amplifier+input/output control circuit 5 amplifies a small difference in potential of the selected bit line pair and supplies the difference to output buffer 8. Output buffer 8 responds to output enable signal /OE which is input from output enable signal input terminal 15, and outputs the data read from sense refresh amplifier+input/output control circuit 5 to data input/output terminal group 16.

As will be described later, super Vcc detection circuit 10 is controlled by signals WCBR and /WCBRB from clock generation circuit 9 and outputs super Vcc detection signals /S to clock generation circuit 9 in response to the input of super Vcc level Vh to output enable signal input terminal 15. Clock generation circuit 9 selects a prescribed operating mode based on super Vcc detection signal /S and signals /CAS, /RAS and /WE externally applied through control signal input terminals 11–13, controls and drives the entire device of DRAM 1.

Figure 2:
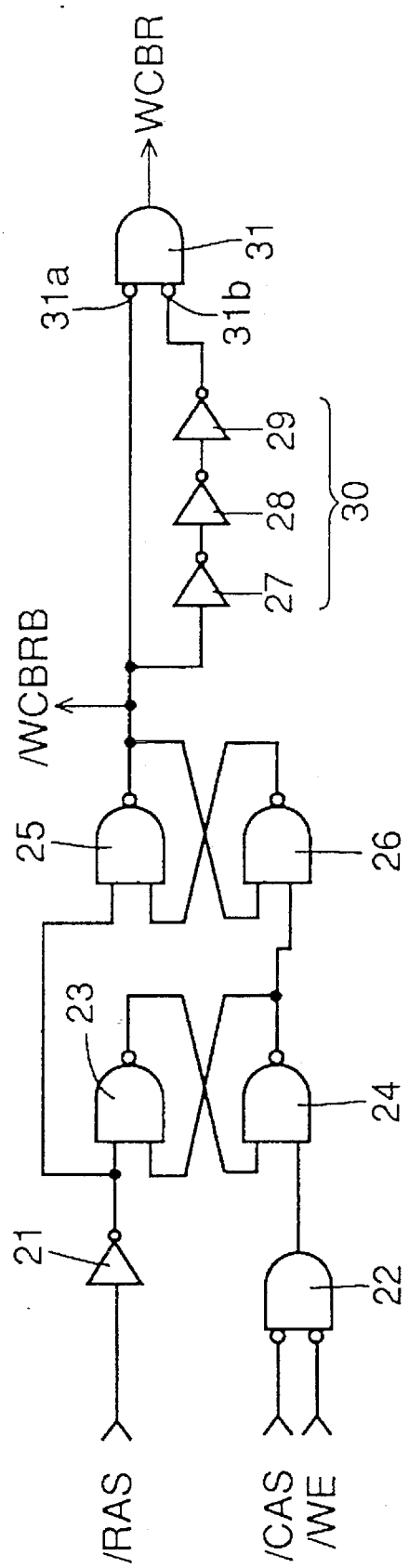
FIG. 2 is a circuit diagram showing a structure of a signal generation circuit included in a clock generation circuit of the DRAM in FIG. 1.

FIG. 2 is a circuit diagram showing a structure of a signal generation circuit 20 for generating signals WCBR and /WCBRB which control super Vcc detection circuit 10. Signal generation circuit 20 is included in clock generation circuit 9 shown in FIG. 1. Signal generation circuit 20 includes an inverter 21, NOR gates 22 and 31, NAND gates 23–26 and a delay circuit 30. Delay circuit 30 includes an odd number (three in this figure) of inverters 27–29 connected in series.

Signal /RAS is input to inverter 21, and signals /CAS and /WE are input to NOR gate 22. NAND gate 23 receives outputs of inverter 21 and NAND gate 24. NAND gate 24 receives outputs of NAND gate 23 and NOR gate 22. NAND gate 25 receives outputs of inverter 21 and NAND gate 26. NAND gate 26 receives outputs of NAND gates 24 and 25. The output of NAND gate 25 becomes signal /WCBRB.

Signal /WCBRB is directly input to one input node of NOR gate 31 and is also input to the other input node of NOR gate 31 through delay circuit 30. The output of NOR gate 1 becomes signal WCBR.

Figure 3:
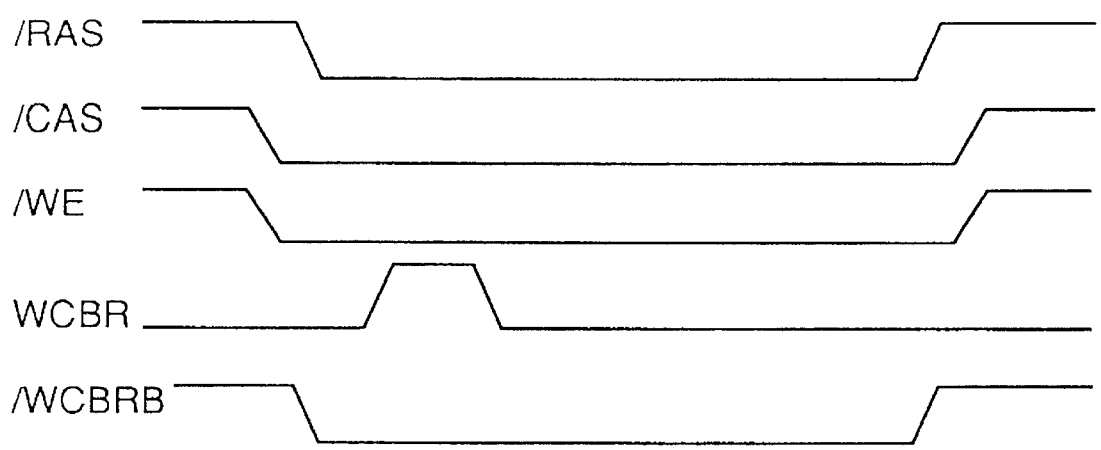
FIG. 3 is a timing chart illustrating operations of the signal generation circuit in FIG. 2.

FIG. 3 is a timing chart illustrating operations of signal generation circuit 20 shown in FIG. 2. Signals WCBR and /WCBRB detect falls of signals /CAS and /WE from an "H" level to an "L" level before signal /RAS falls from an "H" level to an "L" level.

When all of the signals /RAS, /CAS and /WE are at an "H" level, the outputs of NAND gates 23, 24, and 25 attain an "H" level and the output of NAND gate 26 attains an "L" level. Consequently, signal /WCBRB attains an "H" level and signal WCBR attains an "L" level.

When signal /RAS falls to an "L" level with signals /CAS and /WE remaining at an "H" level, the output of NAND gate 23 falls from an "H" level to "L" level. However, the outputs of NAND gates 24, 25 and 26 remain unchanged. Therefore, signals /WCBRB and /WCBR also remain unchanged.

When signals /CAS and /WE fall to an "L" level while signal /RAS remains at an "H" level, the output of NAND gate 24 falls from an "H" level to an "L" level, and the output of NAND gate 26 rises from "L" level to "H" level. At this time, the outputs of NAND gates 23 and 25 remain unchanged and signals /WCBRB and WCBR also remain unchanged.

Next, when signal /RAS falls from an "H" level to an "L" level, the output of NAND gate 25 also falls from "H" level to an "L" level. When signal /RAS rises from an "L" level to an "H" level, the output of NAND gate 25 also rises from an "L" level to "H" level. Therefore, signal /WCBRB changes similarly to signal /RAS.

When signal /WCBRB falls from an "H" level to an "L" level, one input node 31a of NOR gate 31 immediately changes from an "H" level to an "L" level. However, the other input node 31b of NOR gate 31 does not change immediately but changes from an "L" level to an "H" level after the delay time period provided by delay circuit 30. Therefore, there is a period during which the two input nodes of NOR gate 30 are both at an "L" level, and during this period of time the output of NOR gate 30, that is signal WCBR, attains an "H" level.

Figure 4:
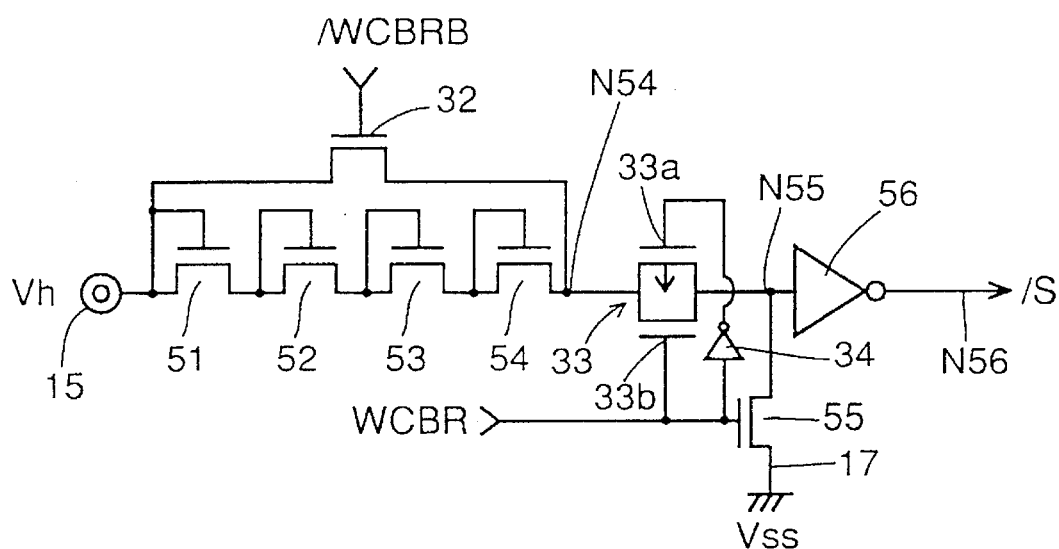
FIG. 4 is a circuit diagram showing a structure of the super Vcc detection circuit of the DRAM in FIG. 1.
Figure 5:
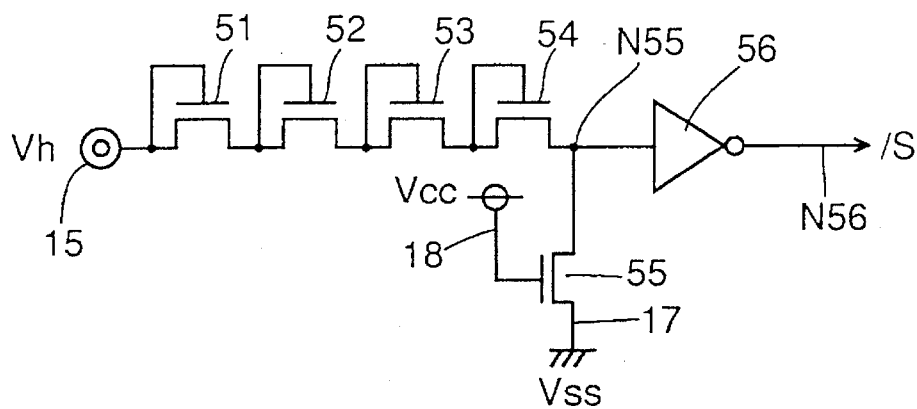
FIG. 5 is a circuit diagram showing a structure of a conventional super Vcc detection circuit.

FIG. 4 is a circuit diagram showing a structure of super Vcc detection circuit 10. Referring to FIG. 4, super Vcc detection circuit 10 is different from the conventional super Vcc detection circuit 50 in FIG. 5 in that an n channel MOS transistor 32, a transfer gate 33 and an inverter 34 are added.

The n channel MOS transistor 32 is connected in parallel to n channel MOS transistors 51–54 and receives signal /WCBRB at its gate. Transfer gate 33 is connected between n channel MOS transistor 54 and node N55. Signal WCBR is directly input to a gate 33b on the n channel MOS transistor side of transfer gate 33, and is input to a gate 33a on the p channel MOS transistor side through inverter 34. The n channel MOS transistor 55 receives at its gate signal WCBR in place of power supply level Vcc.

Now, operations of super Vcc detection circuit 10 in FIG. 4 will be described. When signals /RAS, /CAS and /WE are all at an "H" level and therefore signal WCBR is at an "L" level and signal /WCBRB is at an "H" level, n channel MOS transistor 32 is rendered conductive, and transfer gate 33 and n channel MOS transistor 55 are turned off.

At this time, a connection node N54 between transfer gate 33 and n channel MOS transistor 54 and input terminal 15 are short-circuited through n channel MOS transistor 32, and the potential of node N54 is initialized at, for example, ground level Vss.

Next, when signals /CAS and /WE fall to an "L" level and then signal /RAS falls to an "L" level, signal /WCBRB falls to an "L" level, n channel MOS transistor 32 is turned off, signal WCBR rises to an "H" level, and transfer gate 33 is rendered conductive.

At this time, super Vcc detection circuit 10 comes to have the same structure as the conventional super Vcc detection circuit 50. Accordingly, detection signal /S attains an "L" level when voltage Vh of super Vcc level is applied to input terminal 15, otherwise detection signal /S attains an "H" level.

Clock generation circuit 9 shown in FIG. 1 selects a predetermined operating mode based on signals /CAS, /RAS, /WE, and /S, and controls and drives the entire device of DRAM 1.

In this embodiment, transfer gate 33 is provided between n channel MOS transistor 54 and inverter 56 and is rendered conductive only for a potential detection period during which signal WCBR attains an "H" level, so that no leakage current flows from input terminal 15 through n channel MOS transistor 55 to ground terminal 17 during the period other than the potential detection period. As a result, consumption of current in a DRAM can be reduced.

Furthermore, n channel MOS transistor 32 is connected in parallel to n channel MOS transistors 51–54 and n channel MOS transistor 32 is rendered conductive during a period preceding the potential detection period during which signal /WCBRB is at an "H" level, thereby preventing the potential applied to input terminal 15 from being left at node N54 and therefore preventing malfunction of circuit 17.

Although signal WCBR has a one-shot pulse which attains an "H" level during the delay time provided by delay circuit 30 in this embodiment, signal WCBR can be an inverted version of signal /WCBRB.

A delay circuit can be provided for delaying the fall of signal WCBR from the fall of signal /WCBRB.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device detecting a potential of an input terminal for a prescribed period and operating in accordance with the detected result, said potential detected being higher than a power supply potential, comprising:

a potential detection means for detecting the potential of said input terminal;

a first signal generation means for outputting a first control signal during said prescribed period;

a first connection means provided between said input terminal and said potential detection means and rendered conductive in response to an output of said first control signal from said first signal generation means; and internal means for operation in accordance with the detection result of said potential detection means.

2. A semiconductor device detecting a potential of an input terminal for a prescribed period and operating in accordance with the detected result, comprising:

a potential detection means for detecting the potential of said input terminal;

a first signal generation means for outputting a first control signal during said prescribed period;

a first connection means provided between said input terminal and said potential detection means and rendered conductive in response to an output of said first control signal from said first signal generation means; and internal means for operation in accordance with the detection result of said potential detection means, wherein said potential detection means is activated in response to an output of said first control signal from said first signal generation means.

3. The semiconductor device according to claim 2, further comprising a voltage down means provided between said input terminal and said first connection means for reducing a potential of said input terminal by a prescribed voltage and applying the reduced potential to said potential detection means, wherein said potential detection means detects the potential supplied from said voltage down means.

4. The semiconductor device according to claim 3, wherein said voltage down means includes a predetermined number of transistors connected in series, each transistor having a first electrode and an input electrode connected with each other and a second electrode connected to the first electrode and the input electrode of a transistor in a subsequent stage.

5. The semiconductor device according to claim 4, further comprising a second signal generation means for outputting a second control signal during a period preceding said predetermined period, and a second connection means connected in parallel to said voltage down means and rendered conductive in response to an output of said second control signal from said second signal generation means.

6. A semiconductor memory device comparing a potential of an input terminal and a predetermined reference potential during a prescribed period and operating in accordance with the result of comparison, said potential of the input terminal being higher than a power supply potential, comprising:

a inverter for outputting a signal of a low potential in response to a potential at its input node being higher than its threshold potential, and outputting a signal of a high potential in response to a potential of the input node being lower than the threshold potential;

a first voltage down means for reducing a potential of said input terminal by a difference in potential between said reference potential and the threshold potential of said inverter and supplying the reduced potential to the input node of said inverter;

a first signal generation means for outputting a first control signal during said prescribed period;

a first connection means provided between said input terminal and said first voltage down means and rendered conductive in response to an output of said first control signal from said first signal generation means; and an internal means operating in accordance with the output of said inverter.

7. A semiconductor device comparing a potential of an input terminal and a predetermined reference potential during a prescribed period and operating in accordance with the result of comparison, comprising:

a inverter for outputting a signal of a low potential in response to a potential at its input node being higher than its threshold potential, and outputting a signal of a high potential in response to a potential of the input node being lower than the threshold potential;

a first voltage down means for reducing a potential of said input terminal by a difference in potential between said reference potential and the threshold potential of said inverter and supplying the reduced potential to the input node of said inverter;

a first signal generation means for outputting a first control signal during said prescribed period;

a first connection means provided between said input terminal and said first voltage down means and rendered conductive in response to an output of said first control signal from said first signal generation means; and an internal means operating in accordance with the output of said inverter, wherein said first voltage down means includes a transistor connected between said the input node of said inverter and a ground potential line and receiving a power supply potential at its input electrode.

8. The semiconductor device according to claim 7, wherein said first control signal has the power supply potential, and said transistor receives said first control signal at its input electrode.

9. The semiconductor device according to claim 8, further comprising a second voltage down means provided between said input terminal and said first connection means for reducing a potential of said input terminal by a prescribed voltage and applying the reduced potential to said transistor, wherein said transistor and said second voltage down means reduce the potential of said input terminal by a difference in potential between said reference potential and the threshold potential of said inverter and applying the reduced potential to the input node of said inverter.

10. The semiconductor device according to claim 9, wherein said second voltage down means includes a predetermined number of transistors connected in series, each having a first electrode and an input electrode connected with each other, and a second electrode connected to the first electrode and the input electrode of a transistor in a subsequent stage.

11. The semiconductor device according to claim 10, further comprising a second signal generation means for outputting a second control signal during a period preceding said prescribed period, and a second connection means connected in parallel to said second voltage down means and rendered conductive in response to an output of said second control signal from said second signal generation means.

* * * * *